United States Patent
Sunahara et al.

(10) Patent No.: US 7,208,324 B2
(45) Date of Patent: Apr. 24, 2007

(54) LIQUID COMPOSITION FOR FORMING FERROELECTRIC THIN FILM AND PROCESS FOR PRODUCING FERROELECTRIC THIN FILM

(75) Inventors: Kazuo Sunahara, Yokohama (JP); Hiroyuki Tomonaga, Yokohama (JP); Yoshihisa Beppu, Yokohama (JP)

(73) Assignee: Asahi Glass Company, Limited, Tokyo (JP)

(*) Notice: Subject to any disclaimer, the term of this patent is extended or adjusted under 35 U.S.C. 154(b) by 0 days.

(21) Appl. No.: 11/260,209

(22) Filed: Oct. 28, 2005

(65) Prior Publication Data

US 2006/0046320 A1    Mar. 2, 2006

Related U.S. Application Data

(63) Continuation of application No. PCT/JP04/005913, filed on Apr. 3, 2004.

(30) Foreign Application Priority Data

Apr. 30, 2003  (JP) ............................. 2003-125329

(51) Int. Cl.
*H01L 21/00* (2006.01)
*C01G 49/00* (2006.01)

(52) U.S. Cl. ................ 438/3; 257/E21.664; 423/594.1; 423/598; 423/493; 423/594.2

(58) Field of Classification Search ................ 438/99, 438/3, E21.664; 257/E21.009
See application file for complete search history.

(56) References Cited

U.S. PATENT DOCUMENTS

| | | | | |
|---|---|---|---|---|
| 2,852,400 A * | 9/1958 | Remeika ...................... 501/138 |
| 3,994,823 A * | 11/1976 | Ainger et al. ................ 252/625 |
| 4,077,823 A * | 3/1978 | Wright ........................ 156/212 |
| 4,874,598 A * | 10/1989 | Oda et al. .................... 423/598 |
| 5,453,262 A * | 9/1995 | Dawson et al. .............. 501/124 |
| 5,650,362 A * | 7/1997 | Nashimoto ................ 427/126.3 |
| 5,656,382 A * | 8/1997 | Nashimoto .................. 428/620 |
| 5,849,071 A * | 12/1998 | Derbenwick et al. .. 106/287.11 |
| 5,925,183 A * | 7/1999 | Kato et al. ............. 106/287.18 |
| 6,001,416 A * | 12/1999 | Moriyama et al. .......... 427/100 |
| 6,027,826 A * | 2/2000 | deRochemont et al. ..... 428/702 |
| 6,210,752 B1 * | 4/2001 | Boyle ........................ 427/226 |
| 6,343,855 B1 * | 2/2002 | Sakamaki et al. ............ 347/68 |
| 6,358,433 B1 * | 3/2002 | Tan et al. .............. 252/62.9 R |
| 6,478,412 B1 * | 11/2002 | Hanabata ...................... 347/71 |
| 6,514,476 B1 * | 2/2003 | Messing et al. ............ 423/598 |
| 6,589,457 B1 * | 7/2003 | Li et al. ........................ 264/44 |
| 6,664,115 B2 * | 12/2003 | Azuma et al. .................. 438/3 |
| 2003/0161959 A1 * | 8/2003 | Kodas et al. ............ 427/376.2 |
| 2004/0095658 A1 * | 5/2004 | Buretea et al. ............. 359/853 |
| 2004/0136891 A1 * | 7/2004 | Kijima et al. ................ 423/263 |
| 2005/0036939 A1 * | 2/2005 | Wong et al. ................. 423/598 |
| 2005/0186752 A1 * | 8/2005 | Noguchi ..................... 438/396 |
| 2006/0062723 A1 * | 3/2006 | Noguchi ..................... 423/598 |

FOREIGN PATENT DOCUMENTS

| | | |
|---|---|---|
| JP | 6-119811 | 4/1994 |
| JP | 7-78509 | 3/1995 |
| JP | 7-82022 | 3/1995 |
| JP | 9-86906 | 3/1997 |
| JP | 11-185529 | 7/1999 |
| JP | 2001-240469 | 9/2001 |

OTHER PUBLICATIONS

Kajima et al, Ferroelectrics, (2002) vol. 271, pp. 289-295.
Suzuki et al, Jpn. J. Appl. Phys., (1996) vol. 35, pp. 4896-4899.
Hirano et al, J. Am. Ceram. Soc., (1992) vol. 75, pp. 2785-2789.
Fujimori et al, Jpn. J. Appl. Phys. (1999) vol. 38, pp. 5346-5349.
Zhu et al, Jpn. J. Appl. Phys. (2002) vol. 41, pp. 6969-6975.
U.S. Appl. No. 11/340,548, filed Jan. 27, 2006, Sunahara et al.

* cited by examiner

*Primary Examiner*—B. William Baumeister
*Assistant Examiner*—Igwe U. Anya
(74) *Attorney, Agent, or Firm*—Oblon, Spivak, McClelland, Maier & Neustadt, P.C.

(57) ABSTRACT

It is an object to provide a liquid composition for forming a thin film, with which a ferroelectric thin film having excellent characteristics can be prepared even by baking at a low temperature, and a process for producing a ferroelectric thin film using it. The above object is achieved by use of a liquid composition for forming a ferroelectric thin film, characterized in that in a liquid medium, ferroelectric oxide particles being plate or needle crystals, which are represented by the formula $ABO_3$ (wherein A is at least one member selected from the group consisting of $Ba^{2+}$, $Sr^{2+}$, $Ca^{2+}$, $Pb^{2+}$, $La^{3+}$, $K^+$ and $Na^+$, and B is at least one member selected from the group consisting of $Ti^{4+}$, $Zr^{4+}$, $Nb^{5+}$, $Ta^{5+}$ and $Fe^{3+}$) and have a Perovskite structure and which have an average primary particle size of at most 100 nm and an aspect ratio of at least 2, are dispersed, and a soluble metal compound which forms a ferroelectric oxide by heating, is dissolved.

12 Claims, No Drawings

US 7,208,324 B2

LIQUID COMPOSITION FOR FORMING FERROELECTRIC THIN FILM AND PROCESS FOR PRODUCING FERROELECTRIC THIN FILM

TECHNICAL FIELD

The present invention relates to a liquid composition for forming a ferroelectric thin film and a process for producing a ferroelectric thin film using it.

BACKGROUND ART

A ferroelectric memory (FeRAM) which attracts attention as a new memory device in recent years is to read/write information actively utilizing spontaneous polarization characteristics of a ferroelectric thin film, and is expected as an excellent memory which can overcome drawbacks of previous DRAM, SRAM, FLASH memory and the like, in view of volatility, write speed, reliability, cell area and the like.

As a ferroelectric material for FeRAM, metal oxide materials such as lead zirconate titanate (PZT, PLZT) and bismuth layer-structure Perovskite ferroelectric (BLSF) have been proposed and studied.

Usually, for formation of such a ferroelectric thin film, a film formation method such as a physical vapor deposition method (PVD) such as a sputtering method or a chemical vapor deposition method such as a MOCVD method, or a chemical solution film formation method (solution method) has been proposed. Among them, the solution method is known to be useful to form a ferroelectric thin film most simply at the lowest cost without any special and expensive apparatus required. Further, the solution method has such advantages that the composition can easily be controlled precisely, and that a change in characteristics due to a difference in composition, which is shown in many ferroelectric materials, can be suppressed, and accordingly it is being studied as one of very useful processes for producing a ferroelectric thin film.

Preparation of a ferroelectric thin film by the solution method is a process for forming a ferroelectric thin film by coating on a substrate a solution having a metal compound (precursor) of components as a material homogeneously dissolved, drying the resulting coating film, and pre-baking the coating film as the case requires, and then baking the coating film, for example, in the air at about 700° C. or higher temperature to form a thin film of a crystalline metal oxide. As a soluble metal compound as the material, an organic metal compound such as a metal alkoxide or its partial hydrolysate, or an organic acid salt or a chelate complex compound has been commonly used.

Further, with respect to a cell structure employing the above FeRAM, several cell structures have been proposed, and practically used at present is a so-called planar structure wherein a ferroelectric capacitor and a transistor are connected with local wiring, having a structure disadvantageous in view of reduction of the cell area i.e. high integration.

As a structure which overcomes the above drawback, a stack structure wherein a ferroelectric capacitor is formed on a plug has been proposed, but the reducing atmosphere at the time of formation of multilevel interconnection causes fatal deterioration of characteristics of the ferroelectric thin film. Further, as a structure which overcomes such problems, such a structure has been proposed that after formation of multilevel interconnection i.e. after completion of the logic process, a ferroelectric thin film and a plate line are formed on an outermost layer. In such a structure, a film is formed on a logic circuit, and accordingly the baking temperature at the time of formation of a ferroelectric thin film is required to be decreased to a level of from 400° C. to 450° C.

To cope with the above, various means have been proposed to reduce the crystallization temperature also in preparation of a ferroelectric thin film by the solution method. They may, for example, be a method of appropriately controlling the structure of a precursor as shown in e.g. U.S. Pat. No. 5,925,183, a method of preliminarily adding bismuth silicate as a paraelectric to a coating liquid (Ferroelectrics, vol. 271, p. 289 (2002)), a method of using a lead titanate layer as a seed layer (Jpn. J. Appl. Phys., vol. 35, p. 4,896 (1996)), selection of a proper substrate (J. Am. Ceram. Soc., vol. 75, p. 2,785 (1992)) and a vacuum annealing method (Jpn. J. Appl. Phys., vol. 38, p. 5,346 (1999)). However, reduction of the baking temperature in such conventional methods is limited to a level of 550° C. Accordingly, heretofore, formation of a ferroelectric thin film on a logic circuit which is required for high integration has been considered practically difficult in a case of the solution method.

Further, it has been attempted to form a thin film by using a composition wherein fine ferroelectric particles coexist with a soluble metal salt (Jpn. J. Appl. Phys., vol. 41, p. 6,969 (2002)). However, since the fine ferroelectric particles are particles obtained by long term mechanical grinding, crystallinity or the like of the particles tends to decrease, and no desired chrematistics have been obtained.

DISCLOSURE OF THE INVENTION

The present invention has been made to overcome the above problems of conventional technology, and it is an object of the present invention to provide a liquid composition for forming a thin film, with which, in formation of a ferroelectric thin film by a solution method, baking can be carried out at a relatively low temperature, particularly at a temperature of at most 550° C., or at most 450° C., whereby a ferroelectric thin film can be formed on a logic circuit required for high integration, and with which a thin film having excellent ferroelectric characteristics in view of voltage resistance and spontaneous polarization characteristics particularly fatigue characteristics, etc., can be prepared, and a process for producing a ferroelectric thin film using it.

The present invention has been accomplished by extensive studies, it can achieve the above objects, and it is characterized by having the following constitution.

(1) A liquid composition for forming a ferro electric thin film, characterized in that in a liquid medium, ferroelectric oxide particles being plate or needle crystals, which are represented by the formula $ABO_3$ (wherein A is at least one member selected from the group consisting of $Ba^{2+}$, $Sr^{2+}$, $Ca^{2+}$, $Pb^{2+}$, $La^{3+}$, $K^+$ and $Na^+$, and B is at least one member selected from the group consisting of $Ti^{4+}$, $Zr^{4+}$, $Nb^{5+}$, $Ta^{5+}$ and $Fe^{3+}$) and have a Perovskite structure and which have an average primary particle size of at most 100 nm and an aspect ratio of at least 2, are dispersed, and a soluble metal compound which forms a ferroelectric oxide by heating, is dissolved.

(2) The liquid composition for forming a ferroelectric thin film according to the above (1), wherein the soluble metal compound is a compound which forms a ferroelectric oxide having a Perovskite structure, which is represented by the formula $ABO_3$ (wherein A is at least one member selected from the group consisting of $Ba^{2+}$, $Sr^{2+}$, $Ca^{2+}$, $Pb^{2+}$, $La^{3+}$, $K^+$ and $Na^+$, and B is at least one member selected from the group consisting of $Ti^{4+}$, $Zr^{4+}$, $Nb^5$, $Ta^{5+}$ and $Fe^3+$), by heating.

(3) The liquid composition for forming a ferroelectric thin film according to the above (1) or (2), wherein the ferroelectric oxide particles are particles obtained by crystallizing ferroelectric oxide particles in a glass matrix and then removing the glass matrix component.

(4) The liquid composition for forming a ferroelectric thin film according to any one of the above (1) to (3), wherein the content ratio of the ferroelectric oxide particles/the soluble metal compound is from 5/95 to 95/5 by the mass ratio calculated as oxides.

(5) The liquid composition for forming a ferroelectric thin film according to any one of the above (1) to (4), wherein the total content of the ferroelectric oxide particles and the soluble metal compound is from 1 to 50 mass %.

(6) A process for producing a ferroelectric thin film, which comprises coating on a substrate the liquid composition as defined in any one of the above (1) to (5), followed by baking at a temperature of at most 550° C.

(7) The process for producing a ferroelectric thin film according to the above (6), wherein the thickness of the ferroelectric thin film is from 10 to 300 nm.

BEST MODE FOR CARRYING OUT THE INVENTION

Now, the present invention will be explained in detail below.

In the present invention, the ferroelectric oxide particles (hereinafter sometimes referred to simply as ferroelectric particles) which are represented by the formula $ABO_3$ (wherein A is at least one member selected from the group consisting of $Ba^{2+}$, $Sr^{2+}$, $Ca^{2+}$, $Pb^{2+}$, $La^{3+}$, $K^+$ and $Na^+$, and B is at least one member selected from the group consisting of $Ti^{4+}$, $Zr^{4+}$, $Ta^{5+}$ and $Fe^{3+}$), and have a Perovskite structure are an essential component which is significant in the composition of the present invention. In the present invention, by use of a liquid composition having such ferroelectric particles having high crystallinity dispersed in a liquid medium, the baking temperature required for film formation from a soluble metal compound solution which has been used in the solution method can be drastically decreased.

The ferroelectric particles are particles of a ferroelectric represented by the formula $ABO_3$ (wherein A and B are as defined above) and having a Perovskite structure, and A in the above formula is preferably $Ba^{2+}$, $Sr^{2+}$ or $Pb^{2+}$, and B is preferably $Ti^{4+}$ or $Zr^{4+}$. The ferroelectric is particularly preferably $Pb(Zr_xTi_{1-x})O_3$ (wherein x is from 0.1 to 0.9, hereinafter sometimes referred to as PZT) wherein A is Pb and B is a composite oxide of Ti and Zr. Needless to say, a ferroelectric known as PLZT wherein the Pb site of PZT is partially replaced with another element, for example, a rare earth element such as La, may also be used.

The ferroelectric particles are required to have an average primary particle size of at most 100 nm. The primary particle size is based on the major axis of particles, and the average particle size is a number average particle size. If the average primary particle size is larger than the above, the surface tends to be rough at the time of formation of a thin film, or the filling ratio in the thin film will not increase, whereby dielectric characteristics tend to decrease. Particularly, the average primary particle size is preferably at most 50 nm, particularly preferably from 10 to 30 nm. If the average primary particle size is less than 10 nm, the ferroelectric characteristics of the particles may decrease.

Further, in the present invention, the ferroelectric particles are required to have an average primary particle size within the above range and further required to be anisotropic crystal particles, i.e. plate or needle crystals having an aspect ratio of at least 2. The aspect ratio means a proportion of major axis/minor axis of the anisotropic particles, and it is a proportion of diameter/thickness in the case of plate crystals or a proportion of length/diameter in the case of needle crystals. Particularly, in many of Perovskite type ferroelectric oxides of the present invention, the direction of spontaneous polarization substantially agrees with the direction of the c-axis of the crystal lattice. For example, by use of plate crystals in which a plane ((001) plane) perpendicular to the c-axis has grown, the particles tend to be automatically arranged in the c-axis direction after coating, that is, they tend to be aligned, whereby a high spontaneous polarization value will be obtained. Further, alignment properties of the ferroelectric particles will improve, which is considered to lead to improvement in fatigue characteristics of a ferroelectric thin film. In the present invention, if the aspect ratio is lower than 2, characteristics of a formed ferroelectric thin film tend to decrease. The aspect ratio is particularly preferably at least 5.

The ferroelectric particles having the above characteristics are preferably particles obtained by crystallizing ferroelectric particles in a glass matrix and then removing the glass matrix component, since such particles have particularly high crystallinity. That is, the particles are preferably particles obtained by a glass crystallization method wherein a component to be crystallized as ferroelectric particles is dissolved in a melt of a glass host material, the melt is rapidly cooled for vitrification, and heating and annealing are carried out again so that fine particles are precipitated from the host material. The precipitated fine particles are taken out by dissolving the glass matrix with an appropriate liquid chemical or the like.

The ultrafine particles crystallized in the glass matrix also have such advantages that their form can easily be controlled, fine particles having relatively high anisotropy can easily be prepared depending upon e.g. conditions of the annealing treatment, and particles having a high aspect ratio can easily be obtained.

As the glass host material, a boric acid type, a phosphoric acid type or a silicic acid type may, for example, be used, and a boric acid type glass host material is preferably used in view of melt properties, easiness of production of a composite compound with an aimed oxide, easiness of elution of the matrix, etc.

Now, production of ferroelectric oxide particles will be specifically explained with reference to a process of preparing lead zirconate titanate (PZT) microcrystals as an example below. Ferroelectric particles can be obtained by the following steps (i) to (iv).

(i) A glass forming component (such as boron oxide) and a metal oxide (such as zirconium oxide, titanium oxide or lead oxide) having a composition of aimed ferroelectric oxide particles are mixed, and the mixture is melted at a temperature of at least 1,200° C. (melting).

(ii) The molten glass is rapidly cooled to obtain glass containing metal ions of the ferroelectric oxide composition (vitrification).

(iii) An annealing treatment is carried out at a temperature of a level of from 550° C. to 700° C. to form crystal nuclei of the ferroelectric oxide in the glass, and the annealing conditions are controlled so that the nuclei grow to a predetermined particle size (crystallization).

(iv) A glass host material component (such as boron oxide) is removed by an acid, water or a mixture thereof to obtain ferroelectric particles (such as $Pb(Zr_xTi_{1-x})O_3$) (leaching).

By the above steps in series, crystallization is carried out employing glass having a very high viscosity as a host material in an annealing temperature region, whereby the particle size and the particle shape of the ferroelectric particles can easily be controlled, and microcrystals having high crystallinity can be obtained.

Further, in the present invention, the soluble metal compound capable of becoming a ferroelectric oxide by heating (hereinafter sometimes referred to simply as a soluble metal compound) is a compound which can be converted into an oxide by e.g. thermal decomposition by heating to show ferroelectric properties. In a case where the aimed ferroelectric oxide is a composite oxide, two or more soluble metal compounds are mixed in a predetermined ratio, or a composite metal compound containing two or more metals in a predetermined ratio is used. Such a soluble metal compound may, for example, be an inorganic acid salt such as a nitrate, an organic acid salt such as an ethylhexanoate, an organic metal complex such as an acetylacetone complex, or a metal alkoxide, and it is particularly preferably an organic acid salt, an organic metal complex or a metal alkoxide.

In the procedure for forming the ferroelectric thin film from the liquid composition for forming a ferroelectric thin film of the present invention, the soluble metal compound functions also as a binder of the ferroelectric oxide crystal particles, and it is possible that the soluble metal compound undergoes crystal growth employing the above-described ferroelectric particles as nuclei, whereby crystallization at a lower temperature becomes possible. Further, the soluble metal compound also has a function to improve dielectric characteristics of the obtained ferroelectric thin film as a whole, by forming a ferroelectric oxide in a space between the ferroelectric particles after baking by a heat treatment.

The soluble metal compound may have a composition to form a ferroelectric having substantially the same composition as that of the ferroelectric particles after baking, or may have a composition to form a ferroelectric having a composition different from the ferroelectric particles. However, considering that the ferroelectric particles function as crystal nuclei, it preferably has a composition to form a ferroelectric having a composition as same as possible as the ferroelectric particles.

In the present invention, the content ratio of the ferroelectric particles to the soluble metal compound is preferably such that the ratio of the ferroelectric oxide particles/the soluble metal compound is from 5/95 to 95/5 by the mass ratio calculated as oxides when the soluble metal compound is converted into an oxide by heating. If the content of the ferroelectric particles is higher than this range, the binder component tends to be insufficient, and the formed thin film may not adhere to the substrate. On the other hand, if it is lower than the above range, the effect of addition of the ferroelectric particles is less likely to be obtained. When the above ratio is 30/70 or above, alignment properties of the ferroelectric particles tend to improve, and a ferroelectric thin film having high characteristics tend to be obtained, such being particularly preferred. On the other hand, when the above ratio is 70/30 or below, a dense ferroelectric thin film is likely to be obtained.

The ferroelectric particles and the soluble metal compound are used as a liquid composition comprising the ferroelectric particles dispersed and the soluble metal compound dissolved in an appropriate liquid medium, for e.g. a coating liquid for forming a ferroelectric thin film. When the above liquid composition is formed, the ferroelectric particles and the soluble metal compound may be mixed and then dissolved or dispersed in a liquid medium, or they are dispersed or dissolved in the same or different liquid mediums and then mixed. The liquid medium is not particularly limited so long as the soluble metal compound is dissolved, and it is usually water, an alcohol (such as ethanol or 2-propanol), an ether alcohol (such as 2-ethoxyethanol or 2-ethoxypropanol), an ester (such as butyl acetate or ethyl butyrate), a ketone (such as acetone or methyl isobutyl ketone), an ether (such as dibutyl ether or dioxane), an aliphatic hydrocarbon (such as cyclohexane or decane), an aromatic hydrocarbon (toluene or xylene), a nitrogen-containing organic solvent (such as acetonitrile or N-methylpyrrolidone) or a mixed solvent of two or more thereof. As a specific liquid medium, they are properly selected and mixed depending upon the type and the surface state of the crystal particles in the composition, the type of the soluble metal compound and the coating method. An undissolved soluble metal compound may be partially contained in the liquid medium.

The content of solid matter (the total of the ferroelectric particles and the soluble metal compound) in the liquid composition of the present invention is appropriately adjusted depending upon the aimed ferroelectric film thickness, the coating method of the liquid composition or the like, and is usually preferably from 1 to 50 mass %. If it is lower than the above range, the thin film obtained by coating tends to be very thin, whereby coating has to be repeatedly carried out many times to obtain a desired thickness, and if it is higher than the above range, the stability of the liquid may decrease.

When the ferroelectric particles and the soluble metal compound forming the liquid composition of the present invention are dissolved or dispersed in a medium, known method and apparatus can be used, such as a media mill such as a bead mill or a sand mill, a homogenizer of an ultrasonic type, a stirring type or the like, or a jet mill or a roll mill.

In the liquid composition of the present invention, a dispersing agent to disperse the ferroelectric particles or the soluble metal compound, a surfactant or a surface treating agent to improve rheological characteristics of the coating film, a resin component or the like may be incorporated. However, if they are added in a large amount, they tend to remain as a residual carbon content after baking, and accordingly they are added preferably in a minimum amount required.

The liquid composition of the present invention is coated on a substrate and baked to produce the ferroelectric thin film. As a coating method, a known method may be employed. As specific preferred examples, a spin coating method, a dip coating method, a spray coating method, a screen printing method and a transfer printing method may, for example, be mentioned. Among them, a spin coating method is most preferably used in view of productivity and homogeneity of the obtained thin film.

The substrate used for formation of the thin film in the present invention may, for example, be a single crystal semiconductor substrate of e.g. Si or GaAs, a single crystal dielectric substrate of e.g. $BaTiO_3$, $SrTiO_3$, MgO or $Al_2O_3$, one having on a surface thereof single crystal Si or as an electrode layer, Pt, Ir, $IrO_2$, Ru, $RuO_2$ or the like deposited, or one comprising an insulating layer of e.g. $SiO_2$ or $Si_3N_4$ or a buffer layer of e.g. Ti or Ta provided between a semiconductor substrate and the above electrode layer.

However, the substrate is not limited thereto so long as it has heat resistance to a level of the baking temperature.

The liquid composition of the present invention is coated on such a substrate, and preferably, the liquid composition is dried usually at from 100 to 400° C. for from 1 minute to 2 hours to remove the medium, and then baking is carried out. The baking, in the present invention as mentioned above, can be carried out at a low temperature, and it is carried out preferably at a temperature of at most 550° C., or at most 450° C. in some cases. Needless to say, the baking may be carried out at a temperature higher than 550° C., and baking at such a high temperature may be advantageous depending upon the purpose of use in some cases. The baking time varies depending upon the temperature or the atmosphere, and is preferably from 1 minute to 2 hours. This baking is to decompose and/or crystallize the soluble metal compound, and it may be carried out in an atmosphere such as in the air, in oxygen or in an inert gas, and the atmosphere may appropriately be selected. For the baking, a usual electric furnace such as a diffusion furnace may be used, but a hot plate or an infrared lamp annealing furnace (RTA) with which rapid heat increasing is possible is preferred, since crystallization is more likely to progress.

When the ferroelectric thin film is formed in the present invention as mentioned above, the film thickness is preferably from 10 to 300 nm. If the film thickness is less than 10 nm, it tends to be difficult to obtain a homogeneous film, and if it exceeds 300 nm, the film may be cracked. If no desired film thickness can be achieved by a single process comprising coating, drying and baking, needless to say, this process can be carried out repeatedly.

Now, the present invention will be explained in further detail with reference to Examples. However, the present invention is by no means restricted to the following Examples. Examples 6 to 8 are Comparative Examples.

EXAMPLE 1

Preparation of Ferroelectric Particles (PZT)

Lead oxide, zirconium oxide, titanium oxide (rutile) and boron oxide were weighed in amounts of 47.2 mol %, 13.3 mol %, 11.7 mol % and 27.82 mol % as PbO, $ZrO_2$, $TiO_2$ and $B_2O_3$, respectively, and they were subjected to thorough wet mixing in an automatic mortar using a small amount of ethanol and then dried to obtain a material powder. The obtained material powder was packed in a platinum container (containing 10% of rhodium) equipped with a nozzle for dropping a melt, heated in an electric furnace employing molybdenum silicate as a heating element at 1,350° C. for 2 hours and completely melted. Then, the nozzle portion was heated and the melt was dropped on a twin roll (roll diameter: 150 mm, number of revolutions of roll: 50 rpm, roll surface temperature: 30° C.) disposed below the electric furnace to obtain a flaky solid.

The obtained flaky solid was transparent and as a result of powder X-ray diffraction, confirmed to be an amorphous substance. This flaky solid was heated at 500° C. for 12 hours to crystallize ferroelectric particles in a $B_2O_3$ glass matrix. Then, this flaky powder was added in a 1 mol/L aqueous acetic acid solution kept at 80° C. and stirred for 6 hours and then, subjected to centrifugal separation, washed with water and dried to obtain a white powder.

The obtained white powder was identified by powder X-ray diffraction and as a result, it was found to be a powder consisting of $Pb(Zr_{0.52}Ti_{0.48})O_3$ crystals alone. The ratio of Zr and Ti was determined by quantitative analysis by means of ICP method. Further, as a result of observation by a transmission electron microscope, the crystals had a plate shape, and had an average primary particle size of 20 nm, a thickness of 9 nm and an aspect ratio of 2.22.

EXAMPLE 2

Preparation of Ferroelectric Particles $BaTiO_3$

Barium carbonate, titanium oxide (rutile) and boron oxide were weighed in amounts of 50.0, 16.7 and 33.3 mol % as BaO, $TiO_2$ and $B_2O_3$, respectively, and they were subjected to thorough wet mixing by an automatic mortar using a small amount of ethanol and then dried to obtain a material powder. The obtained material powder was packed in a platinum container (containing 10% of rhodium) equipped with a nozzle for dropping a melt, heated in an electric furnace employing molybdenum silicate as a heating element at 1,350° C. for 2 hours and completely melted. Then, the nozzle portion was heated and the melt was dropped on a twin roll (roll diameter: 150 mm, number of revolutions of roll: 50 rpm and roll surface temperature: 30° C.) disposed below the electric furnace to obtain a flaky solid.

The obtained flaky solid was transparent and as a result of powder X-ray diffraction, confirmed to be an amorphous substance. This flaky substance was heated at 590° C. for 12 hours to carry out a crystallization treatment. Then, this flaky powder was added in a 1 mol/L aqueous acetic acid solution kept at 80° C. and stirred for 12 hours and then, subjected to centrifugal separation, washed with water and dried to obtain a white powder.

The obtained white powder was identified by powder X-ray diffraction and as a result, found to be a powder consisting of barium titanate crystals alone. Further, as a result of observation by a transmission electron microscope, the crystals had a plate shape, and had an average primary particle size of 25 nm, a thickness of 10 nm and an aspect ratio of 2.50.

EXAMPLE 3

Preparation of PZT Ferroelectric Thin Film

The PZT crystal particles obtained in Example 1 are dispersed in ethanol by using a wet jet mill and subjected to centrifugal separation to remove coarse particles, whereby a dispersion A containing 10 mass % of PZT is obtained. The dispersed particle size of the dispersion A is measured by using a laser scattering particles size distribution meter and as a result, it is 90 nm, and the dispersion A is a favorable dispersion.

Lead acetate, tetrabutyl titanate, tetrabutyl zirconate and acetylacetone are dissolved in 2-ethoxypropanol in a ratio of Pb:Zr:Ti:acetylacetone=1.05:0.53:0.47:1.00 (molar ratio), and reflux is carried out in a stream of nitrogen at 130° C. for 4 hours. The solution is cooled to room temperature, and ion-exchanged water is slowly added in an amount of two times (molar ratio) the amount of (Pb+Zr+Ti). Then, reflux with heating is carried out again in a stream of nitrogen at 130° C. for 8 hours to obtain a soluble metal compound solution B. The concentration of metal sources in the liquid is 10 mass % as calculated as oxides.

The dispersion A and the soluble metal compound solution B are mixed in a mass ratio (calculated as oxides) of 50/50 to obtain a composition of the present invention.

Using as a substrate a silicon single crystal substrate having Pt layer (thickness: 200 nm)/Ti layer (thickness: 20 nm)/thermal-oxidized $SiO_2$ layer (thickness: 800 nm) laminated on its surface, the above composition is coated on the Pt layer on the surface by a spin coating method and dried on a hot plate at 200° C. for 30 minutes. This treatment comprising coating and drying is carried out three times and then baking is carried out by using a RTA furnace in oxygen at 450° C. for 30 minutes.

The obtained coating film has a thickness of 100 nm, and as a result of X-ray diffraction, it is a coating film consisting of a PZT crystalline phase aligned in the c-axis direction by priority alone. Further, a Pt electrode of 0.1 mm in diameter is prepared on this coating film by a DC sputtering method, and a post-annealing treatment is carried out in a RTA furnace at 400° C. for 15 minutes to prepare a capacitor, and ferroelectric hysteresis characteristics are measured. As a result, the coercive electric field value is 44 kV/cm and the spontaneous polarization value is 35 $\mu C/cm^2$. Fatigue characteristics of the obtained ferroelectric capacitor are evaluated (in a cycle test, number of cycles when the spontaneous polarization decreases by 5% or more of the initial value) and as a result, the change in the spontaneous polarization value is suppressed to be within 5% even after 108 cycles at ±3 V.

EXAMPLE 4

The $BaTiO_3$ crystal particles obtained in Example 2 are dispersed in ethanol by using a wet jet mill and subjected to centrifugal separation to remove coarse particles, whereby a dispersion C containing 10 mass % of $BaTiO_3$ is obtained. The dispersed particle size of the dispersion C is measured by using a laser scattering particles size distribution meter and as a result, it is 80 nm, and the dispersion C is a favorable dispersion.

Metal barium, tetrabutyl titanate and diethylene glycol are dissolved in 2-methoxypropanol in a ratio of Ba:Ti:diethylene glycol=1:1:1 (molar ratio), and reflux is carried out in a stream of nitrogen at 110° C. for 4 hours. After cooling to room temperature, ion-exchanged water is slowly added in an amount of two times (molar ratio) the amount of (Ba+Ti). Then, reflux with heating is carried out again in a stream of nitrogen at 110° C. for 8 hours to obtain a soluble metal compound solution D. The concentration of metal sources in the liquid is 10 mass % as calculated as oxides.

The dispersion C and the soluble metal compound solution D are mixed in a mass ratio (calculated as oxides) of 70/30 to obtain a composition of the present invention.

Using as a substrate a silicon single crystal substrate having Pt layer (thickness: 200 nm)/Ti layer (thickness: 20 nm)/thermal-oxidized $SiO_2$ layer (thickness: 800 nm) laminated on its surface, the above composition is coated on the Pt layer on the surface by a spin coating method and dried on a hot plate at 200° C. for 30 minutes. This treatment comprising coating and drying is carried out three times and then baking is carried out by using a RTA furnace in oxygen at 500° C. for 20 minutes.

The obtained coating film has a thickness of 120 nm, and as a result of X-ray diffraction, it is a coating film consisting of a $BaTiO_3$ crystalline phase aligned in the c-axis direction by priority alone. Further, a Pt electrode of 0.1 mm in diameter is prepared on this coating film by a DC sputtering method, and a post-annealing treatment is carried out in a RTA furnace at 450° C. for 15 minutes to prepare a capacitor, and ferroelectric hysteresis characteristics are measured. As a result, the coercive electric field value is 30 kV/cm and the spontaneous polarization value is 19 $\mu C/cm^2$. Fatigue characteristics of the obtained ferroelectric capacitor are evaluated in the same manner as in Example 3 and as a result, the change in the spontaneous polarization value is suppressed to be within about 5% even after $10^6$ cycles at ±3 V.

EXAMPLES 5 TO 7

A ferroelectric thin film is prepared in the same manner as in Example 3 by changing the mixture ratio of the dispersion A of Example 1 and the soluble metal compound solution B to be in a ratio as shown in Table 1, and evaluation is carried out, whereupon results as shown in Table 1 are obtained. Ferroelectric thin films obtained in Examples 5 and 6 comprise, as a result of X-ray diffraction, a PZT single phase aligned in the c-axis direction by priority.

EXAMPLE 8

Film formation and evaluation are carried out in the same manner as in Example 3 by using, instead of the ferroelectric crystal dispersion A of Example 3, a dispersion E containing 10 mass % of spherical PZT crystal particles having an average primary particle size of 1.2 µm (aspect ratio 1) prepared by a solid phase method. The obtained phase is a ferroelectric phase comprising a PZT single phase, and the polarization characteristics are equal to those of the coating film obtained in Example 3. However, as a result of evaluation of fatigue characteristics, the spontaneous polarization becomes substantially 0 after $10^6$ cycles at 3 V, and deterioration is remarkable. As a result of X-ray diffraction, the ferroelectric phase is not aligned.

EXAMPLE 9

Instead of the ferroelectric crystal dispersion A of Example 3, spherical PZT particles (average primary particle size: 1.2 µm) prepared by a solid phase method are ground by using a planetary ball mill for 40 hours. As a result of observation by an electron microscope, the particles are pulverized to a particle size of 40 nm. Using this fine powder, a dispersion is prepared in the same manner as in preparation of the dispersion A of Example 3, and a PZT coating film is prepared in the same manner as in Example 3. The obtained phase is a ferroelectric phase comprising a PZT single phase, however, the spontaneous polarization value is small, which may be due to influence of distortion of the PZT crystals by grinding, and further, with respect to fatigue characteristics, the spontaneous polarization decreases to 50% of the initial value after $10^6$ cycles. As a result of X-ray diffraction, the ferroelectric phase is not aligned.

TABLE 1

| Ex. | Crystal particles (a) | Average primary particle size (nm) | Aspect ratio | Soluble metal compound (b) | Mass ratio of (a)/(b) in composition | Baking temp. |
|---|---|---|---|---|---|---|
| Ex. 3 | PZT of Ex. 1 | 20 | 2.22 | PZT Zr/Ti = 53/47 | 50/50 | 450° C. |
| Ex. 4 | BT of Ex. 2 | 25 | 2.50 | BT | 70/30 | 500° C. |
| Ex. 5 | PZT of Ex. 1 | 20 | 2.22 | PZT Zr/Ti = 53/47 | 66/34 | 450° C. |
| Ex. 6 | PZT of Ex. 1 | 25 | 2.22 | PZT Zr/Ti = 53/47 | 80/20 | 450° C. |
| Ex. 7 | — | — | — | PZT Zr/Ti = 53/47 | 0/100 | 450° C. |

TABLE 1-continued

| Ex. | Crystal particles (a) | Average primary particle size (nm) | Aspect ratio | Soluble metal compound (b) | Mass ratio of (a)/(b) in composition | Baking temp. |
|---|---|---|---|---|---|---|
| Ex. 8 | PZT | 1200 | 1 | PZT Zr/Ti = 53/47 | 50/50 | 450° C. |
| Ex. 9 | Ground PZT | 40 | — | PZT Zr/Ti = 53/47 | 50/50 | 450° C. |

TABLE 2

| Ex. | Thickness (nm) | Crystalline phase | Coercive electric field (kV/cm) | Spontaneous polarization (μC/cm$^2$) | Fatigue characteristics* (cycles) |
|---|---|---|---|---|---|
| Ex. 3 | 100 | PZT single phase | 44 | 35 | >10$^8$ |
| Ex. 4 | 120 | BT single phase | 30 | 19 | ~10$^6$ |
| Ex. 5 | 100 | PZT single phase | 49 | 39 | >10$^8$ |
| Ex. 6 | 100 | PZT single phase | 51 | 39 | >10$^8$ |
| Ex. 7 | 110 | Amorphous | — | — | — |
| Ex. 8 | 115 | PZT single phase | 48 | 29 | <10$^4$ |
| Ex. 9 | 100 | PZT single phase | 35 | 12 | <10$^5$ |

INDUSTRIAL APPLICABILITY

The present invention provide a composition for forming a thin film, with which, in formation of a ferroelectric thin film by a solution method, baking can be carried out at a relatively low temperature, particularly at a temperature of at most 550° C., or at most 450° C., whereby a ferroelectric thin film can be formed on a theoretical circuit required for high integration, and with which a thin film having excellent ferroelectric characteristics in view of high voltage resistance and spontaneous polarization characteristics, particularly fatigue characteristics, can be prepared, and a process for producing a ferroelectric thin film using it.

The ferroelectric thin film produced by the present invention is advantageously useful in production of a memory device and other devices. Particularly when it has a thickness of from 10 to 300 nm, its application to FeRAM can be expected.

The entire disclosure of Japanese Patent Application No. 2003-125329 filed on Apr. 30, 2003 including specification, claims and summary is incorporated herein by reference in its entirety.

What is claimed is:

1. A liquid composition for forming a ferroelectric thin film, wherein in a liquid medium, ferroelectric oxide particles being plate or needle crystals, which are represented by the formula ABO$_3$ (wherein A is at least one member selected from the group consisting of Ba$^{2+}$, Sr$^{2+}$, Ca$^{2+}$, Pb$^{2+}$, La$^{3+}$, K$^+$ and Na$^+$, and B is at least one member selected from the group consisting of Ti$^{4+}$, Zr$^{4+}$, Nb$^{5+}$, Ta$^{5+}$ and Fe$^{3+}$) and have a Perovskite structure and which have an average primary particle size of at most 100 nm and an aspect ratio of at least 2, are dispersed, and a soluble metal compound which forms a ferroelectric oxide by heating, is dissolved, wherein the soluble metal compound is a compound which forms a ferroelectric oxide having a Perovskite structure, which is represented by the formula ABO$_3$ (wherein A is at least one member selected from the group consisting of Ba$^{2+}$, Sr$^{2+}$, Ca$^{2+}$, Pb$^{2+}$, La$^{3+}$, K$^+$ and Na$^+$, and B is at least one member selected from the group consisting of Ti$^{4+}$, Zr$^{4+}$, Nb$^{5+}$, Ta$^{5+}$ and Fe$^{3+}$), by heating.

2. The liquid composition for forming a ferroelectric thin film according to claim 1, wherein the ferro electric oxide particles are particles obtained by crystallizing ferroelectric oxide particles in a glass matrix and then removing the glass matrix component.

3. The liquid composition for forming a ferroelectric thin film according to claim 1, wherein the content ratio of the ferroelectric oxide particles/the soluble metal compound is from 5/95 to 95/5 by the mass ratio calculated as oxides.

4. The liquid composition for forming a ferroelectric thin film according to claim 1, wherein the total content of the ferroelectric oxide particles and the soluble metal compound is from 1 to 50 mass %.

5. The liquid composition for forming a ferroelectric thin film according to claim 1, wherein the ferro electric oxide particles have an aspect ratio of at least 5.

6. The liquid composition for forming a ferroelectric thin film according to claim 1, wherein the content ratio of the ferroelectric oxide particles/the soluble metal compound is from 30/70 to 95/5 by the mass ratio calculated as oxides.

7. A process for producing a ferroelectric thin film, which comprises coating on a substrate the liquid composition as defined in claim 1, followed by baking at a temperature of at most 550° C.

8. The process for producing a ferroelectric thin film according to claim 7, wherein the thickness of the ferroelectric thin film is from 10 to 300 nm.

9. The process for producing a ferroelectric thin film according to claim 7, wherein the baking is carried out at a temperature of at most 450° C.

10. The liquid composition according to claim 1, wherein in the formula ABO$_3$ of the ferroelectric oxide particles, A is at least one member selected from the group consisting of Ba$^{2+}$, Sr$^{2+}$, Pb$^{2+}$ and La$^{3+}$, and B is at least one member selected from the group consisting of Ti$^{4+}$ and Zr$^{4+}$.

11. The liquid composition according to claim 10, wherein the soluble metal compound is a compound which forms a ferroelectric oxide having a Perovskite structure represented by the formula ABO$_3$ (wherein A is at least one member selected from the group consisting of Ba$^{2+}$, Sr$^{2+}$, Pb$^{2+}$ and La$^{3+}$, and B is at least one member selected from the group consisting of Ti$^{4+}$ and Zr$^{4+}$) by heating.

12. The liquid composition according to claim 1, wherein A and B in the formula ABO$_3$ are the same for the ferroelectric oxide particles and for the ferroelectric oxide formed from the soluble metal compound.

* * * * *

UNITED STATES PATENT AND TRADEMARK OFFICE
CERTIFICATE OF CORRECTION

| | |
|---|---|
| PATENT NO. | : 7,208,324 B2 |
| APPLICATION NO. | : 11/260209 |
| DATED | : April 24, 2007 |
| INVENTOR(S) | : Sunahara et al. |

It is certified that error appears in the above-identified patent and that said Letters Patent is hereby corrected as shown below:

On the title page, Item (63), the Related U.S. Application Data information is incorrect. Item (63) should read:

-- Related U.S. application Data

(63)  Continuation of application No. PCT/JP04/005913, filed on Apr. 23, 2004. --

Signed and Sealed this

Twenty-eighth Day of August, 2007

JON W. DUDAS
*Director of the United States Patent and Trademark Office*